US006593055B2

(12) United States Patent
Shimazu et al.

(10) Patent No.: US 6,593,055 B2

(45) Date of Patent: Jul. 15, 2003

(54) MULTI-LAYER THERMALLY IMAGEABLE ELEMENT

(75) Inventors: Ken-Ichi Shimazu, Briarcliff Manor, NY (US); Jayanti Patel, Woodcliff Lake, NJ (US)

(73) Assignee: Kodak Polychrome Graphics LLC, Norwalk, CT (US)

(*) Notice: Subject to any disclaimer, the term of this patent is extended or adjusted under 35 U.S.C. 154(b) by 134 days.

(21) Appl. No.: 09/946,720

(22) Filed: Sep. 5, 2001

(65) Prior Publication Data

US 2003/0104307 A1 Jun. 5, 2003

(51) Int. Cl.$^{7}$ ................................................ G03F 7/023

(52) U.S. Cl. .................... 430/166; 430/271.1; 430/302; 101/451; 101/456; 101/465; 101/467

(58) Field of Search ............................. 430/166, 271.1, 430/302; 101/451, 456, 465, 467

(56) References Cited

U.S. PATENT DOCUMENTS

| | | | | | |
|---|---|---|---|---|---|
| 5,379,698 | A | | 1/1995 | Nowak et al. | 101/454 |
| 5,900,345 | A | * | 5/1999 | Platzer et al. | 430/156 |
| 6,040,113 | A | * | 3/2000 | Van Damme et al. | 430/271.1 |
| 6,083,663 | A | * | 7/2000 | Vermeersch et al. | 430/302 |
| 6,087,068 | A | * | 7/2000 | Sato et al. | 430/271.1 |
| 6,165,689 | A | * | 12/2000 | Vermeersch et al. | 430/302 |
| 6,192,799 | B1 | * | 2/2001 | Damme et al. | 101/457 |
| 6,235,451 | B1 | * | 5/2001 | Damme et al. | 430/302 |
| 6,280,899 | B1 | | 8/2001 | Parsons et al. | 430/270.1 |
| 6,294,311 | B1 | * | 9/2001 | Shimazu et al. | 430/271.1 |
| 6,342,336 | B2 | * | 1/2002 | Verschueren et al. | 430/271.1 |
| 6,358,669 | B1 | * | 3/2002 | Savariar-Hauck et al. | 430/273.1 |
| 6,528,228 | B2 | * | 3/2003 | Hauck et al. | 430/166 |
| 6,534,238 | B1 | * | 3/2003 | Savariar-Hauck et al. | 430/270.1 |

FOREIGN PATENT DOCUMENTS

| | | |
|---|---|---|
| EP | 0 864 420 | 9/1998 |
| EP | 0 908 305 | 4/1999 |
| EP | 0 908 307 | 4/1999 |
| EP | 0 908 779 | 4/1999 |
| EP | 0 908 784 | 4/1999 |
| EP | 0 940 266 | 9/1999 |
| EP | 0 950 518 | 10/1999 |
| EP | 1 023 994 | 8/2000 |
| JP | 0 960 728 | 12/1999 |

* cited by examiner

*Primary Examiner*—John S. Chu

(74) *Attorney, Agent, or Firm*—RatnerPrestia

(57) ABSTRACT

Multi-layer thermally imageable elements, useful as a lithographic printing plate precursors, are disclosed. The elements contain a top layer, an absorber layer that contains a photothermal conversion material and a hydrophilic substrate. An optional underlayer may also be present between the absorber layer and the hydrophilic substrate. The elements can be thermally imaged and processed with an aqueous alkaline developer.

38 Claims, No Drawings

MULTI-LAYER THERMALLY IMAGEABLE ELEMENT

FIELD OF THE INVENTION

This invention relates to lithographic printing. More particularly, this invention relates to multi-layer thermally imageable elements, useful as lithographic printing plate precursors, that can be thermally imaged and processed with aqueous alkaline developers.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plates, also called printing plate precursors, typically comprise an imageable layer applied over the surface of a hydrophilic substrate. The imageable layer includes one or more radiation-sensitive components, which may be dispersed in a suitable binder. Alternatively, the radiation-sensitive component can also be the binder material.

Thermally imageable elements useful as lithographic printing plate precursors, which obviate the need for exposure through a negative, are becoming increasingly important in the printing industry. After imagewise thermal exposure, the rate of removal of the exposed regions by a developer is greater than the rate of removal of the unexposed regions so that the exposed regions are removed by the developer to form an image. Such systems are disclosed in, for example, Parsons, WO 97/39894 and U.S. application Ser. No. 08/981,620; Nagasaka, EP 0 823 327; Miyake, EP 0 909 627; West, WO 98/42507 and U.S. application Ser. No. 08/821,844; and Nguyen, WO 99/11458, and U.S. application Ser. No. 08/922,190.

Although advances have been made in the preparation of heat-sensitive elements for the production of lithographic printing plates, there remains a need for such elements having improved sensitivity to infrared laser imaging devices.

SUMMARY OF THE INVENTION

The invention is a thermally imageable element having improved sensitivity to infrared laser imaging devices. The element comprises:

(a) a hydrophilic substrate;

(b) an absorber layer; and (c) a top layer;

wherein:

the top layer comprises a first polymeric material;

the top layer is ink receptive and insoluble in an aqueous alkaline developer;

the top layer and the absorber layer are each removable by the aqueous alkaline developer following thermal exposure; and the absorber layer consists essentially of a photothermal conversion material or a mixture of photothermal conversion materials and, optionally, a surfactant or a mixture of surfactants.

In one embodiment of the invention, an underlayer comprising a second polymeric material is between the support and the absorber layer.

In another aspect, the invention is a method for producing an image useful as a lithographic printing plate. The method comprises imaging the thermally imageable element and developing it with an aqueous alkaline developer. In another aspect, the invention is a method of printing using the printing plate and an aqueous fountain solution.

DETAILED DESCRIPTION OF THE INVENTION

This invention is a thermally imageable element. The element comprises a hydrophilic substrate, an absorber layer, and a top layer. The absorber layer contains a photothermal conversion material. The element may also comprise an underlayer between the substrate and the absorber layer. Unless the context indicates otherwise, in the specification and claims, the terms “first polymeric material,” “second polymeric material,” “photothermal conversion material,” “dissolution inhibitor,” and similar terms also refer to mixtures of such materials.

Hydrophilic Substrate

The hydrophilic substrate, i.e., the substrate that comprises at least one hydrophilic surface, comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

The surface of the aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 to about 600 $\mu$m.

Typically, the substrate comprises an interayer between the aluminum support and the imageable layer. The interlayer may be formed by treatment of the support with, for example, silicate, dextrine, hexafluorosilicic acid, phosphate/fluoride, polyvinyl phosphonic acid (PVPA) or polyvinyl phosphonic acid copolymers.

Absorber Layer

The absorber layer absorbs radiation, preferably radiation in the range of about 800 nm to 1200 nm, the range of radiation commonly used for imaging thermally imageable elements. An absorber, sometimes referred to as “a photothermal conversion material,” is present in the absorber layer. Photothermal conversion materials absorb radiation and convert it to heat. Photothermal conversion materials may absorb ultraviolet, visible, and/or infrared radiation and convert it to heat.

The photothermal conversion material may be either a dye or pigment, such as a dye or pigment of the squarylium, merocyanine, indolizine, pyrylium, or metal diothiolene class. Examples of absorbing pigments are Projet 900, Projet 860 and Projet 830 (all available from the Zeneca Corporation). Carbon black pigments may also be used. Because of their wide absorption bands, carbon. black-based plates can be used with multiple infrared imaging devices having a wide range of peak emission wavelengths.

Dyes, especially dyes that are soluble in the aqueous alkaline developer, are preferred to prevent sludging of the developer by insoluble material. The dye may be chosen, for example, from indoaniline dyes, oxonol dyes, porphyrin derivatives, anthraquinone dyes, merostyryl dyes, pyrylium compounds, and sqarylium derivatives. Absorbing dyes are disclosed in numerous disclosures and patent applications in the field, for example, Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618. Examples of useful absorbing dyes include, ADS-830 WS and ADS-1064 (both available from American Dye Source, Montreal, Canada), EC2117 (available from FEW, Wolfen, Germany),. Cyasorb IR 99 and Cyasorb IR 165 (both available from Glendale Protective Technology), Epolite IV-62B and Epolite III-178 (both available from the Epoline), PINA-780 (available from the Allied Signal Corporation), SpectraIR 830A and SpectraIR 840A (both available from Spectra Colors).

The absorber layer consists essentially of the photothermal conversion material or a mixture of photothermal conversion materials and, optionally, a surfactant, such as a polyethoxylated dimethylpolysiloxane copolymer, or a mixture of surfactants. In particular, the absorber layer is substantially free of binders, such as those used as the first polymeric material and the second polymeric material. The surfactant may be present to help disperse the photothermal conversion material in a coating solvent.

The thickness of the absorber layer is generally sufficient to absorb at least 90%, preferably at least 99%, of the imaging radiation. As is well known to those skilled in the art, the amount of absorber required to absorb a particular amount of radiation can be determined from the thickness of the absorber layer and the extinction coefficient of the absorber at the imaging wavelength using Beers law. Typically the absorber layer has a coating weight of about 0.02 $g/m^2$ to about 2 $g/m^2$, preferably about 0.05 $g/m^2$ to about 1.5 $g/m^2$.

Top Layer

The top layer is ink receptive and protects the underlying layer or layers from the developer. It is insoluble in aqueous alkaline developer prior to imaging. However, exposed (i.e., imaged) regions of the top layer are removable by an aqueous alkaline developer after thermal exposure (i.e., thermal imaging). Though not being bound by any theory or explanation, it is believed that thermal exposure causes the top layer to more readily dissolve or disperse in the aqueous developer and/or weakens the bond between the top layer and the absorber layer. This allows the developer to penetrate the top layer, the absorber layer, and, if present, the underlayer, and remove the absorber layer and dissolve the underlayer, if present, in the exposed regions, revealing the underlying hydrophilic surface of the hydrophilic substrate.

The top layer comprises a first polymeric material. The first polymeric material may be insoluble in the aqueous alkaline developer. It is removed and dispersed in the developer when the developer penetrates the top layer in the exposed regions and dissolves or disperses the underlying layer or layers in these regions. Useful polymers of this type include acrylic polymers and copolymers; polystyrene; styrene-acrylic copolymers; polyesters, polyamides; polyureas; polyurethanes; nitrocellulosics; epoxy resins; and combinations thereof. Preferred polymers of this type are polymethylmethacrylate, nitrocellulose and polystyrene.

The top layer may be a positive-working photoimageable composition. In this instance, the exposed regions of the top layer become more readily soluble in an aqueous alkaline developer following thermal exposure.

Positive-working photoimageable compositions are well known. They are discussed, for example, in Chapter 5 of *Photoreactive Polymers: the Science and Technology of Resists*, A. Reiser, Wiley, N.Y., 1989, pp. 178–225. These compositions comprise a first polymeric material that is a water insoluble, alkali soluble binder as well as a material that comprises a photosensitive moiety. The photosensitive moiety may be bonded to the first polymeric material and/or be present in a separate compound.

Polymers that contain phenolic hydroxyl groups, i.e., phenolic resins, are preferred. Preferably the first polymeric material is a light-stable, water-insoluble, aqueous alkaline developer-soluble, film-forming polymeric material that has a multiplicity of phenolic hydroxyl groups, either on the polymer backbone or on pendant groups. Phenolic groups impart aqueous alkaline developer solubility to the top layer and are also believed to form a thermally frangible complex with the dissolution inhibitor. Novolac resins, resol resins, acrylic resins that contain pendent phenol groups, and polyvinyl phenol resins are preferred phenolic resins. Novolac resins are more preferred.

Novolac resins are commercially available and are well known to those skilled in the art. They are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. Particularly useful novolac resins are prepared by reacting m-cresol, mixtures of m-cresol and p-cresol, or phenol with formaldehyde using conventional conditions.

Other phenolic resins useful as the first polymeric material include polyvinyl compounds having phenolic hydroxyl groups. Such compounds include, for example, polyhydroxystyrenes and copolymers containing recurring units of a hydroxystyrene, and polymers and copolymers containing recurring units of substituted hydroxystyrenes. The first polymeric material may also be a water insoluble, base soluble polymeric compound having pendent sulfonamide groups, such as is described in Aoshima, U.S. Pat. No. 5,141,838 (EP 330,239).

The photosensitive moiety is typically the o-diazonaphthoquinone moiety. Compounds that contain the o-diazonaphthoquinone moiety (i.e., quinone-diazides), preferably compounds that comprise an o-diazonaphthoquinone moiety attached to a ballasting moiety that has a molecular weight of at least 1500, but less than about 5000, are preferred. Typically, these compounds are prepared by the reaction of a 1,2-naphthoquinone diazide having a halogenosulfonyl group, typically a sulfonylchloride group, at the 4- or 5-position with a mono- or polyhydroxyphenyl compound, such as mono- or poly-hydroxy benzophenone.

Polymeric diazonaphthoquinone compounds include derivatized resins formed by the reaction of a reactive derivative that contains a diazonaphtho-quinone moiety and a polymeric material that contains a suitable reactive group, such as a hydroxyl or amino group. Suitable polymeric materials for forming these derivatized resins include the novolac resins, resole resins, polyvinyl phenols, acrylate and methacrylate copolymers of hydroxy-containing monomers such as hydroxystyrene. Representative reactive derivatives include sulfonic and carboxylic acid, ester, or amide derivatives of the diazonaphthoquinone moiety. Derivatization of phenolic resins with compounds that contain the diazonaphtho-quinone moiety is well known in the art and is described, for example, in West, U.S. Pat. Nos. 5,705,308, and 5,705,322.

In one aspect, the positive-working thermally imageable top layer comprises the first polymeric material and a dissolution inhibitor. Such systems are disclosed in, for example, Parsons, WO 97/39894; Nagasaka, EP 0 823 327; Miyake, EP 0 909 627; West, WO 98/42507; and Nguyen, WO 99/11458. The first polymeric material is typically a phenolic resin, such as a novolac resin.

Dissolution inhibitors are believed to reversibly reduce the rate at which the first polymeric material dissolves in an aqueous alkaline developer. In general, such compounds should have an "inhibition factor" of at least 0.5, and preferably at least 5. Inhibition factors can be measured using the procedure described by Shih et al, *Macromolecules*, 27, 3330 (1994).

Useful polar groups for dissolution inhibitors include, for example, diazo groups; diazonium groups; keto groups; sulfonic acid ester groups; phosphate esters groups; triarylmethane groups; onium groups, such as sulfonium, iodonium, and phosphonium; groups in which a nitrogen atom is incorporated into a heterocyclic ring; and groups that contain a positively charged atom, especially a positively charged nitrogen atom, typically a quaternized nitrogen atom, i.e., ammonium groups. Compounds containing other polar groups, such as ether, amine, azo, nitro, ferrocenium, sulfoxide, sulfone, and disulfone may also be useful as dissolution inhibitors. Monomeric or polymeric acetals having recurring acetal or ketal groups, monomeric or polymeric ortho carboxylic acid esters having at least one ortho carboxylic acid ester or amide group, enol ethers, N-acyliminocarbonates, cyclic acetals or ketals, β-ketoesters or β-ketoamides may also be useful as dissolution inhibitors.

Compounds that contain a positively charged (i.e., quaternized) nitrogen atom useful as dissolution inhibitors include, for example, tetraalkyl ammonium compounds, quinolinium compounds, benzothiazolium compounds, pyridinium compounds, and imidazolium compounds.

Quaternized heterocyclic compounds are useful as dissolution inhibitors. Representative imidazolium compounds include Monazoline C, Monazoline O, Monazoline CY, and Monazoline T, all of which are manufactured by Mona Industries. Representative quinolinium dissolution inhibitors include 1-ethyl-2-methyl quinolinium iodide, 1-ethyl-4-methyl quinolinium iodide and cyanine dyes that comprise a quinolinium moiety such as Quinoldine Blue. Representative benzothiazolium compounds include 3-ethyl-2(3H)-benzothiazolylidene)-2-methyl-1-(propenyl) benzothiazolium cationic dyes and 3-ethyl-2-methyl benzothiazolium iodide. Suitable pyridinium dissolution inhibitors include cetyl pyridinium bromide and ethyl viologen dications.

Diazonium salts are useful as dissolution inhibitors and include, for example, substituted and unsubstituted diphenylamine diazonium salts, such as methoxy-substituted diphenylamine diazonium hexafluoroborates. These compounds are particularly useful in non-preheat plates.

A preferred group of dissolution inhibitors are triarylmethane dyes, such as ethyl violet, crystal violet, malachite green, brilliant green, Victoria blue B, Victoria blue R, and Victoria blue BO. These compounds can also act as contrast dyes, which distinguish the unimaged regions from the imaged regions in the developed imageable element.

The dissolution inhibitor may be a compound that comprises an o-diazo-naphthoquinone moiety, such as is discussed below. The derivatized resins that comprise an o-diazonaphthoquinone moiety can act as both the first polymeric material and the dissolution inhibitor. They can be used alone, or they can be combined with other polymeric materials and/or dissolution inhibitors.

When a dissolution inhibitor is present in the top layer, its amount can vary widely, but generally it is at least about 0.1 wt %, typically about 0.5 wt % to about 30 wt %, preferably about 1 wt % to 15 wt %, based on the total dry composition weight of the layer.

Alternatively, or additionally, the first polymeric material itself can comprise polar groups that act as acceptor sites for hydrogen bonding with the hydroxy groups present in the polymeric material and, thus, act as a dissolution inhibitor. Using well-known methods, a portion of the hydroxyl groups of the binder can be derivatized to introduce polar groups, for example carboxylic acid esters, such as benzoate esters; phosphate esters; ethers, such as phenyl ethers; and sulfonic acid esters, such as methyl sulfonates, phenyl sulfonates, p-toluene sulfonates (tosylates), and p-bromophenyl sulfonates (brosylates). An example of a resin derivatized with a compound that comprises a diazonaphthoquinone moiety is P-3000, a naphthoquinone diazide of a pyrogallol/acetone resin (available from PCAS, France). These derivatized polymeric materials can act as both the second polymeric material and a dissolution inhibitor. They can be used alone in the top layer, or they can be combined with other polymeric materials and/or dissolution inhibitors.

Alternatively, the top layer may contain the first polymeric material but be free of materials that function as dissolution inhibitors for the first polymeric material. In this case, the top layer consists essentially of the first polymeric material. These systems are disclosed in Hauck, U.S. patent application Ser. No. 09/638,556, filed Aug. 14, 2000. These systems are-developed in alkaline solutions having a pH of at least 7 to about 11. Preferably the aqueous alkaline developer for these systems has a pH about 8 to about 10.5, more preferably about 9 to 10, and even more preferably about 10. Developers with a pH in the range of 13 or higher cannot be used with these systems.

The top layer may also comprise a dye to aid in the visual inspection of the exposed and/or developed element. Printout dyes distinguish the exposed regions from the unexposed regions during processing. Contrast dyes distinguish the unimaged regions from the imaged regions in the developed plate.

Substantially all the imaging radiation should be absorbed by the absorber layer. Although the top layer may absorb ultraviolet and/or visible radiation, such as when a dye such as ethyl violet is used as the dissolution inhibitor or when a dye is added to the top layer for inspection purposes, the top layer should be substantially free of materials that absorb imaging radiation, typically infrared radiation in the range of about 800 nm to about 1200 nm, more typically radiation at about 830 nm or at about 1056 nm. In particular, the top layer should be substantially free of the photothermal conversion material.

Underlayer

When present, the underlayer is between the hydrophilic surface of the hydrophilic substrate and the absorber layer. After imaging, it is removed in the imaged regions along with the absorber layer and the top layer by the aqueous alkaline developer to expose the underlying hydrophilic surface of the substrate. It is preferably soluble in the aqueous alkaline developer to prevent sludging of the developer. Preferably it is soluble in a wholly aqueous developer, i.e. one that does not include added organic solvents.

The underlayer comprises a second polymeric material. The second polymeric material preferably is soluble in an aqueous alkaline developer. In addition, the second polymeric material should be insoluble in the solvent used to coat the top layer so that the top layer can be coated over the underlayer without dissolving the underlayer.

Polymeric materials useful as the second polymeric material include those that contain an acid and/or phenolic functionality, and mixtures of such materials. Useful polymeric materials include carboxy functional acrylics, vinyl acetate/crotonate/vinyl neodecanoate copolymers, styrene maleic anhydride copolymers, phenolic resins, maleated wood rosin, and combinations thereof.

Solvent resistant underlayers are disclosed in Shimazu, WO 01/46318. Particularly useful polymeric materials are copolymers that comprise N-substituted maleimides, especially N-phenylmaleimide; polyvinylacetals; methacrylamides, especially methacylamide; and acrylic and/or methacrylic acid, especially methacrylic acid. More preferably two functional groups are present in the polymeric material, and most preferably all three functional groups are present in the polymeric material. The preferred polymeric materials of this type are copolymers of N-phenylmaleimide, methacrylamide, and methacrylic acid, more preferably those that contain about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. Other hydrophilic monomers, such as hydroxyethyl methacrylate, may be used in place of some or all of the methacrylamide. Other aqueous alkaline soluble monomers, such as acrylic acid, may be used in place of some or all of the methacrylic acid.

These polymeric materials are soluble in aqueous alkaline developers. In addition they are soluble in methyl lactate/methanol/dioxolane (15:42.5:42.5 wt %) mixture, which can be used as the coating solvent for the underlayer. However, they are poorly soluble in solvents such as acetone, isopropyl alcohol, butyl acetate, and butanol, which can be used as solvents to coat the top layer over the underlayer without dissolving the underlayer. These polymeric materials are typically resistant to washes with 80 wt % diacetone alcohol/20 wt % water.

Another group of preferred polymeric materials for the second polymeric material are aqueous alkaline developer soluble copolymers that comprise a monomer that has a urea bond in its side chain (i.e., a pendent urea group), such are disclosed in Ishizuka, U.S. Pat. No. 5,731,127. These copolymers comprise about 10 to 80 wt %, preferably about 20 to 80 wt %, of one of more monomers represented by the general formula:

$$CH_2{=}C(R){-}CO_2{-}X{-}NH{-}CO{-}NH{-}Y{-}Z$$

in which R is —H or —$CH_3$; X is a bivalent linking group; Y is a substituted or unsubstituted bivalent aromatic group; and Z is —OH, —COOH, or —$SO_2NH_2$.

R is preferably $CH_3$. Preferably X is a substituted or unsubstituted alkylene group, substituted or unsubstituted phenylene [$C_6H_4$] group, or substituted or unsubstituted naphthalene [$C_{10}H_6$] group; such as —$(CH_2)_n$—, in which n is 2 to 8; 1,2-, 1,3-, and 1,4-phenylene; and 1,4-, 2,7-, and 1,8-naphthalene. More preferably X is unsubstituted and even more preferably n is 2 or 3; most preferably X is —$(CH_2CH_2)$—. Preferably Y is a substituted or unsubstituted phenylene group or substituted or unsubstituted naphthalene group; such as 1,2-, 1,3-, and 1,4-phenylene; and 1,4-, 2,7-, and 1,8-naphthalene. More preferably Y is unsubstituted, most preferably unsubstituted 1,4-phenylene. Z is —OH, —COOH, or —$SO_2NH_2$, preferably —OH. A preferred monomer is:

$$CH_2{=}C(CH_3){-}CO_2{-}CH_2CH_2{-}NH{-}CO{-}NH{-}p{-}C_6H_4{-}Z$$

in which Z is —OH, —COOH, or —$SO_2NH_2$, preferably —OH.

In the synthesis of a copolymer, one or more of the urea group containing monomers may be used. The copolymers also comprise 20 to 90 wt % other polymerizable monomers, such as maleimide, acrylic acid, methacrylic acid, acrylic esters, methacrylic esters, acrylonitrile, methacrylonitrile, acrylamides, and methacrylamides. A copolymer that comprises in excess of 60 mol % and not more than 90 mol % of acrylonitrile and/or methacrylonitrile in addition to acrylamide and/or methacrylamide provides superior physical properties. More preferably the alkaline soluble copolymers comprise 30 to 70 wt % urea group containing monomer; 20 to 60 wt % acrylonitrile or methacrylonitrile, preferably acrylonitrile; and 5 to 25 wt % acrylamide or methacrylamide, preferably methacrylamide.

The polymeric materials described above are soluble in aqueous alkaline developers. In addition, they are soluble in polar solvents, such as ethylene glycol monomethyl ether, which can be used as the coating solvent for the underlayer. However, they are poorly soluble in less polar solvents, such as 2-butanone (methyl ethyl ketone), which can be used as a solvent to coat the top layer over the underlayer without dissolving the underlayer.

Both these groups of polymeric materials can be prepared by methods, such as free radical polymerization, well known to those skilled in the art.

Synthesis of the aqueous alkaline soluble copolymers that have urea bonds in their side chains is disclosed, for example, in Ishizuka, U.S. Pat. No. 5,731,127.

Other aqueous alkaline developer soluble polymeric materials may be useful in the underlayer. Derivatives of methyl vinyl ether/maleic anhydride copolymers that contain an N-substituted cyclic imide moiety and derivatives of styrene/maleic anhydride copolymers that contain an N-substituted cyclic imide moiety may be useful if they have the required solubility characteristics. These copolymers can be prepared by reaction of the maleic anhydride copolymer with an amine, such as p-aminobenzenesulfonamide, or p-aminophenol, followed by ring closure by acid.

Another group of polymeric materials that are useful in the underlayer include aqueous alkaline developer soluble copolymers that comprise about 10 to 90 mol % of a sulfonamide monomer unit, especially those that comprise N-(p-aminosulfonylphenyl)methacrylamide, N-(m-aminosulfonylphenyl)methacrylamide N-(o-aminosulfonylphenyl)methacrylamide, and/or the corresponding acrylamide. Useful alkaline developer soluble polymeric materials that comprise a pendent sulfonamide group, their method of preparation, and monomers useful for their preparation, are disclosed in Aoshima, U.S. Pat. No. 5,141,838. Particularly useful polymeric materials comprise (1) the sulfonamide monomer unit, especially N-(p-aminosulfonylphenyl)methacrylamide; (2) acrylonitrile and/or methacrylo-nitrile; and (3) methyl methacrylate and/or methyl acrylate.

Combinations of alkaline developer soluble polymeric materials may be used in the underlayer to provide improved chemical resistance, i.e., resistance to both fountain solution and to aggressive washes. A combination of a polymeric material that is resistant to 80 wt % diacetone alcohol/20 wt % water, which tests resistance to a UV wash, with a polymeric material that is resistant to 80 wt % 2-butoxyethanol/20 wt % water, which tests resistance to alcohol sub fountain solution, surprisingly produces a layer that shows good resistance to both solvent mixtures. Preferably, the second polymeric material has a one-minute soak loss of less than about 20%, more preferably less than about 10%, and most preferably less than about 5% in 80 wt % diacetone alcohol/20 wt % water, and the second polymeric material has a one-minute soak loss of less than about 20%, more preferably less than about 10%, and most preferably less than about 10%, in 80 wt % 2-butoxyethanol/20 wt % water. One-minute soak loss is measured by coating a layer of the polymeric material on a substrate, typically at a coating weight of about 1.5 g/m$^2$, soaking the coated substrate in the appropriate solvent for one minute at room temperature, drying the coated substrate, and measuring the weight loss as a percent of the total weight of polymeric material present on the substrate.

The ability of an underlayer to withstand both fountain solution and aggressive washes can be estimated by a chemical resistance parameter (CRP), defined as follows:

$$CRP=[(100-a)(100-b)]/10^4$$

in which:

a is the one minute % soak loss in 80 wt % diacetone alcohol/20 wt % water; and b is the one minute % soak loss in 80 wt % 2-butoxyethanol/20 wt % water.

The chemical resistance parameter should be greater than about 0.4, preferably greater than about 0.5, more preferably greater than about 0.6. In favorable cases a chemical resistance parameter of at least about 0.65 can be obtained. The one-minute soak loss in each solvent should be less than about 60%, preferably less than about 40%, and more preferably less than about 35%. Preferably, the one-minute soak loss should be less than about 60%, preferably less than about 40%, and more preferably less than about 35%, in one solvent and less than about 40%, more preferably less than about 30%; and more preferably less than about 20%, and most preferably less than about 10% in the other solvent.

Combination of (1) a copolymer that comprises N-substituted maleimides, especially N-phenylmaleimide; methacrylamides, especially methacrylamide; and acrylic and/or methacrylic acid, especially methacrylic acid (2) with an alkaline soluble copolymer that comprises a urea in its side chain or with an alkaline soluble copolymer that comprises 10 to 90 mol % of a sulfonamide monomer unit, especially one that comprise N-(p-aminosulfonylphenyl) methacrylamide, N-(m-aminosulfonylphenyl) methacrylamide N-(o-aminosulfonylphenyl) methacrylamide, and/or the corresponding acrylamide, is especially advantageous. One or more other polymeric materials, such a phenolic resin, may also be present in the combination. Preferred other polymeric materials, when present, are novolac resins.

When a combination of polymeric materials is used, the underlayer typically comprises about 10% to about 90% by weight of the polymeric material that is resistant to 80 wt % diacetone alcohol/20 wt % water, and about 10% to about 90% by weight of the polymeric material that is resistant to 80 wt % 2-butoxyethanol/20 wt % water, based on the total weight these polymeric materials in the underlayer. Preferably the underlayer comprises about 40% to about 85% by weight of the polymeric material that is resistant to 80 wt % diacetone alcohol/20 wt % water and about 15% to about 60% of the polymeric material that is resistant to 80 wt % 2-butoxyethanol/20 wt % water, based on the total weight the first and second polymeric materials in the underlayer. These polymeric materials together typically comprise at least about 50 wt %, preferably at least about 60 wt %, and more preferably at least about 65 wt %, of the underlayer, based on total weight of the materials in the underlayer. Up to about 20 wt %, preferably about 1 to about 20 wt %, of other polymeric materials may be present in the underlayer, based on the total amount of all the polymeric materials in the underlayer.

The underlayer may comprise a negative-working, base soluble photo-sensitive composition. Such compositions are often referred to as “photo-hardenable compositions” or “photoinsolubilizable compositions” because they become developer insoluble on irradiation. Typically these compositions comprise materials that undergo photocrosslinking, photodimerization, and/or photo-polymerization on exposure to actinic radiation, typically ultraviolet light. Photo-hardenable compositions produce printing plates with high press life and resistance to press room chemicals. Negative working systems are discussed, for example, in Chapter 2 of *Photoreactive Polymers: the Science and Technology of Resists*, A. Reiser, Wiley, N.Y., 1989, pp. 22–64.

The underlayer may comprise a negative-working diazonium-containing composition. Typically the diazonium- containing compound is a diazonium polycondensation product. Diazonium polycondensation products are well known to those skilled in the art. They may be prepared, for example, by condensation of a diazo monomer, such as is described in Toyama, U.S. Pat. No. 4,687,727 with a condensation agent, such as formaldehyde, acetaldehyde, propionaldehyde, butyraldehyde, isobutyraldehyde or benzaldehyde. Furthermore, mixed condensation products are used which, apart from the diazonium salt units, comprise other non-photosensitive units which are derived from condensable compounds, in particular from aromatic amines, phenols, phenol ethers, aromatic thioethers, aromatic hydrocarbons, aromatic heterocycles or organic acid amides. Especially advantageous examples of diazonium polycondensation products are reaction products of diphenylamine-4-diazonium salts, optionally having a methoxy group in the phenyl group bearing the diazo group, with formaldehyde or 4,4'-bis-methoxymethyl diphenyl ether. Aromatic sulfonates such as 4-tolylsulfonate or mesitylene sulfonate, tetrafluoroborate, hexafluorophosphate, hexafluoroantimonate and hexafluoroarsenate are particularly suitable as anions of these diazo resins. The diazonium polycondensation product is preferably present in the photosensitive mixtures in an amount of from 3 to 60 wt %.

Numerous binders (second polymeric materials) are known. One such system is described in Baumann,.U.S. Pat. No. 5,700,619. The binder is an acetalized polyvinyl alcohol, with pendent carboxyl groups.

The underlayer may comprise a photopolymerizable composition. Preferred photosensitive compositions are photopolymerizable compositions, which comprise one or more monomers, one or more binders (second polymeric materials), and one or more photoinitiator systems. Such systems are well known in the art, and are discussed, for example, in Photopolymers: Radiation Curable Imaging Systems, B. M. Monroe, in *Radiation Curing: Science and Technology*, S. P. Pappas, Ed., Plenum, N.Y., 1992, pp. 399–440.

Photopolymerizable compositions comprise at least one ethylenically unsaturated compound that undergoes free-radical initiated polymerization, generally known as a monomer. The monomers are typically multifunctional, i.e., they comprise more than one ethylenically unsaturated, free radical polymerizable group. Typical multifunctional monomers are unsaturated esters of alcohols, preferably acrylate and methacrylate esters of polyols. Oligomers and/or prepolymers, such as urethane acrylate and methacrylate, epoxide acrylate and methacrylate, polyester acrylate and methacrylate, polyether acrylate and methacrylate or unsaturated polyester resins, may also be used. Numerous other unsaturated monomers polymerizable by free-radical initiated polymerization and useful in photopolymerizable compositions are known to those skilled in the art.

The composition comprises at least one preformed macromolecular polymeric material, generally known as a binder (second polymeric materials. In general, the binder should be swellable or, preferably, soluble in the coating solvent and compatible with the other components of the photopolymerizable system. Representative binders, or second polymeric materials, are poly(methyl methacrylate) and copolymers of methyl methacrylate with other alkyl acrylates, alkyl methacrylates, methacrylic acid, and/or acrylic acid. Numerous other binders useful in photopolymerizable compositions are known to those skilled in the art.

When the material is to be cured by irradiation with ultraviolet or visible radiation following imaging and development, a free radical generating, initiating system activatable by ultraviolet or visible radiation, known as a photoinitiating system, may be present to facilitate polymerization of the polymerizable monomers. The photoinitiator system absorbs in ultraviolet and/or visible regions of the spectrum, i.e., in the range of from 300 to 800 nm, preferably in the ultraviolet, i.e. 300 nm to 400 nm.

The photoinitiating system may be a single compound or a mixture of compounds. Suitable photoinitiating systems are disclosed in "Photoinitiators for Free-Radical-Initiated Photoimaging Systems," by B. M. Monroe and G. C. Weed, *Chem. Rev.*, 93, 435–448 (1993) and in "Free Radical Polymerization" by K. K. Dietliker, in *Chemistry and Technology of UV and EB Formulation for Coatings, Inks, and Paints*, P. K. T. Oldring, ed, SITA Technology Ltd., London, 1991, Vol. 3, pp. 59–525. Typical free radical photoinitiating compounds include Michlers ketone/benzophenone; benzophenone, 2-hydroxy-2-methyl-1-phenylpropan-1-one (DAROCUR 1173); 2,4,6-trimethylbenzolyl-diphenylphosphine oxide (LUCERIN® TPO); 2-isopropylthioxanthone; 2-chlorothioxanthone; 2,2-dimethoxy-2-phenyl-acetophenone (IGACURE® 651, LUCERIN® BDK); 2-methyl-1-[4-(methylthio)phenyl]-2-morpholinopropanone-1 (IRGACURE® 907); 1-hydroxycyclohexylphenyl ketone (HCPK, IRGACURE® 184); bis (2,6-dimethoxybenzolyl)-2,4,4-trimethyl-pentylphosphine oxide; and combinations thereof.

A hybrid system comprising a combination of a diazonium poly-condensation product and a free polymerizable system may be advantageous for certain applications. The compositions of such hybrid systems preferably comprise 1 to 50% diazonium polycondensation products, 0.5 to 20% photoinitiators as well as 5 to 80% free radical polymerizable components.

Photocrosslinkable systems typically comprise at least one binder and a photoactivated at least bifunctional crosslinking agent that crosslinks the binder on irradiation. Organic azides, which are believed to form nitrenes on irradiation, have been used to crosslink binders. Diazido compounds, such as the disulfonated derivative of 4,4'-diazidostilbene, are preferred azides for photocrosslinking.

Photodimerizable systems comprise a binder that forms a crosslink on irradiation. Photocrosslinkable binders include, for example, the polyvinyl alcohols functionalized with cinnamate groups, such as are described in Minsk, U.S. Pat. Nos. 2,690,966, and 2,725,372, or with N-alkyl styrylpyridinium or N-alkyl styrylquinolinium groups, such as are described in, for example, Ichimura, U.S. Pat. Nos. 4,272,620; 4,287,335; 4,339,524; 4,564,580; and 4,777,114. Other photocrosslinkable systems are described in, for example, in Osada, U.S. Pat. No. 3,804,628, and Aoshima, U.S. Pat. No. 5,240,808.

Conventional additives, such as dyes, pigments, plasticizers, sensitizers, stabilizers, surfactants, coating aids, and components, such as leucodyes that produce printout images can be included in the negative-working, alkaline developable compositions.

Although a negative working photosensitive composition is used in the underlayer, the system is positive-working. Imaging and development removes the top layer, absorber layer, and underlayer in the imaged, rather than the unimaged, regions. However, even though the system is positive working, it can be developed in developers normally used for conventional negative working printing plate precursors. If the printing plate precursor contains a photopolymerizable composition, after thermal imaging and development, it is preferably overall, or blanket, exposed with ultraviolet radiation to insolublize or "harden" the image. If the printing plate contains a phenolic resin and a photoacid generator, following thermal imaging and development it is preferably overall, or blanket, exposed with ultraviolet radiation and then heated or baked to insolublize or "harden" the image.

Preparation of the Thermally Imageable Element

The thermally imageable element may be prepared by sequentially applying the underlayer, if present, over the hydrophilic surface of the hydrophilic substrate, applying the absorber layer over the underlayer or over the hydrophilic surface of the hydrophilic substrate if the underlayer is not present, and then applying the top layer over the absorbing layer using conventional coating and/or lamination methods. However, it is important to avoid intermixing the layers during this process. In particular, it is important that the top layer be substantially free of the photothermal conversion material.

If present, the underlayer may be applied over the hydrophilic substrate by any conventional method. Typically the ingredients are dispersed or dissolved in a suitable coating solvent, and the resulting mixtures coated by conventional methods, such as spin coating, bar coating, gravure coating, or roller coating. The absorber layer may be applied over the underlayer typically to the surface of the underlayer, or over the hydrophilic substrate if the underlayer is not present, typically to the hydrophilic surface of the hydrophilic substrate, by any conventional method, such as those listed above. The term "solvent" includes mixtures of solvents, especially mixtures of organic solvents.

Selection of the solvents used to coat the layers depends on the nature of the first polymeric material, the photothermal conversion material, and, if present, the second polymeric material, as well as the other ingredients present in the layers, if any. To prevent the underlayer from dissolving and mixing with the absorber layer when the absorber layer is coated over the underlayer, the absorber layer should be coated from a solvent in which the second polymeric material is essentially insoluble. Thus, the coating solvent for the absorber layer should be a solvent in which the photoconversion material is sufficiently soluble that the absorber layer can be formed and in which the second polymeric material and the other components of the underlayer, if any, are essentially insoluble. If the photothermal conversion material is a pigment, it should be dispersed in a coating solvent in which the second polymeric material and the other components of the underlayer, if any, are essentially insoluble.

To prevent the absorber layer from dissolving and mixing with the top layer when the absorber layer is coated over the underlayer, the top layer should be coated from a solvent in which the photothermal conversion material is essentially insoluble. Although the solvents used depend on the nature of the polymeric materials, typically the second polymeric material will be soluble in more polar solvents and insoluble in less polar solvents so that the solvent used to coat the underlayer is more polar than the solvent used to coat the top layer.

The top layer may be coated as an aqueous dispersion to avoid dissolving the absorber layer during the coating process. Alternatively, the underlayer, the top layer or both layers may be applied by conventional extrusion coating methods from a melt mixture of layer components. Typically, such a melt mixture contains no volatile organic solvents. If the photothermal conversion material is a sublimable dye, the absorber layer may be deposited by sublimation of the photothermal conversion material onto the underlayer, if present, or the hydrophilic surface of the hydrophilic substrate if the underlayer is not present.

Imaging and Processing

Imaging of the thermally imageable element may be carried out by well-known methods. The element may be imaged with a laser or an array of lasers emitting modulated near infrared or infrared radiation in a wavelength region that is absorbed by the absorber layer. Infrared radiation, especially infrared radiation in the range of about 800 nm to about 1200 nm, is typically used for imaging thermally imageable elements. Imaging is conveniently carried out with a laser emitting at about 830 nm or at about 1056 nm. Suitable commercially available imaging devices include image setters such as the Creo Trendsetter (CREO, British Columbia, Canada) and the Gerber Crescent 42T (Gerber).

Alternatively, the thermally imageable element may be imaged using a conventional apparatus containing a thermal printing head. An imaging apparatus suitable for use in conjunction with thermally imageable elements includes at least one thermal head but would usually include a thermal head array, such as a TDK Model No. LV5416 used in thermal fax machines and sublimation printers or the GS618-400 thermal plotter (Oyo Instruments, Houston, Tex., USA).

Imaging produces an imaged element, which comprises a latent image of image (unexposed) regions and non-image (exposed) regions. Development of the imaged element to form a printing plate, or printing form, converts the latent image to an image by removing the non-image (exposed) regions, revealing the hydrophilic surface of the underlying substrate.

The developer may be any liquid or solution that can penetrate and remove the exposed regions of the top layer, the underlying regions of the absorber layer, and, if present, the underlying regions of the underlayer without substantially affecting the complimentary unexposed regions. While not being bound by any theory or explanation, it is believed that image discrimination is based on a kinetic effect. The exposed regions of the top layer are removed more rapidly in the developer than the unexposed regions. Development is carried out for a long enough time to remove the exposed regions of the top layer, the underlying regions of the absorber layer, and, if present, the underlying regions of the underlayer in the developer, but not long enough to remove the unexposed regions of the top layer. Hence, the exposed regions are described as being "soluble" or "removable" in the developer because they are removed, and dissolved and/or dispersed, more rapidly in the developer than the unexposed regions. Typically, the underlayer, if present, is dissolved in the developer, the absorber layer is either dissolved or dispersed in the developer, and the top layer is dispersed in the developer.

For top layers that comprise a dissolution inhibitor, useful developers are aqueous solutions having a pH of about 7 or above. Preferred aqueous alkaline developers are those that have a pH between about 8 and about 13.5, typically at least about 11, preferably at least about 12. Wholly aqueous developers, i.e., those that do not comprise an added organic solvent, are preferred. Useful developers include commercially available developers, such as PC3000, PC955, and PC9000, aqueous alkaline developers each available from Kodak Polychrome Graphics LLC. Developers are described for example, in Yamasue, U.S. Pat. No. 4,259,434; Seino, U.S. Pat. No. 4,452,880; Miller, U.S. Pat. No. 5,851,735; Eckler, U.S. Pat. No. 5,998,102; Miro, EB-A-0 732 628; Toyama, GB-A-2,276,729 (DE-A-4 411 176); and Fiebag, U.S. Pat. No. 6,143,479.

Development is typically carried out in a processor equipped with an immersion-type developing bath, a section for rinsing with water, a gumming section, a drying section, and a conductivity-measuring unit. Typically, the developer is applied to the imaged precursor by rubbing or wiping the element with an applicator containing the developer. Alternatively, the imaged precursor may be brushed with the developer or the developer may be applied to the precursor by spraying the element with sufficient force to remove the exposed regions. In either instance, a printing plate is produced. Development may be carried out in a commercially available processor, such as a Mercury Processor (Kodak Polychrome Graphics).

Following development, the printing plate is rinsed with water and dried. Drying may be conveniently carried out by infrared radiators or with hot air. After drying, the printing plate may be treated with a gumming solution. A gumming solution comprises one or more water-soluble polymers, for example polyvinylalcohol, polymethacrylic acid, polymethacrylamide, polyhydroxyethyl-methacrylate, polyvinylmethylether, gelatin, and polysaccharide such as dextran, pullulan, cellulose, gum arabic, and alginic acid. A preferred material is gum arabic.

A developed and gummed plate may also be baked to increase the run length of the plate. Baking can be carried out, for example at about 220° C. to about 240° C. for about 7 to 10 minutes, or at a temperature of 120° C. for 30 min.

If the underlayer comprises a negative-working, base soluble photosensitive composition, the developed element may be exposed to actinic radiation to harden the composition. Any convenient source or sources of actinic radiation providing wavelengths in the region of the spectrum that overlap the absorption bands of the photosensitive composition can be used to activate photoreaction. By "actinic radiation" is meant any radiation that can induce photoreaction, or hardening in the underlayer. Conventional light sources include fluorescent lamps, mercury lamps, metal additive lamps, and arc lamps. Coherent light sources are lasers, such as xenon, argon ion, and ionized neon lasers, as well as tunable dye lasers and the frequency doubled neodymium: YAG laser. Exposure is preferably an overall or blanket exposure.

Once the imageable element has been imaged and developed, printing can then be carried out by applying a fountain solution and then a lithographic ink to the image on its surface. The fountain solution is taken up by the imaged (exposed) regions, i.e., the surface of the hydrophilic substrate exposed by imaging and development process, and the ink is taken up by the unimaged (unexposed) regions. The ink is then transferred to a suitable receiving material (such as cloth, paper, metal, glass or plastic) either directly or indirectly through the use of an offset printing blanket to provide a desired impression of the image thereon. The imaging members can be cleaned between impressions, if desired, using conventional cleaning means.

The advantageous properties of this invention can be observed by reference to the following examples, which illustrate but do not limit the invention. In the specification, examples, and claims, unless indicated otherwise, all percentages are percentages by weight, based on the weight of the developer.

EXAMPLES

Glossary

| | |
|---|---|
| ADS-830 WS | Infrared absorbing dye ($\lambda_{max}$ = 830 nm) (American Dye Source, Montreal, Canada) |
| Copolymer A | Copolymer of N-phenylmaleimide, methacrylamide, and methacrylic acid (45:35:20 mol %) |
| Cymel-303 | Hexamethoxymethylmelamine (American Cyanamid, Toronto, Ontario, Canada) |
| Byk 307 | Polyethoxylated dimethylpolysiloxane copolymer (Bky-Chemie, Wallingford, CT, USA) |
| Ethyl Violet | C.I. 42600; CAS 2390-59-2 ($\lambda_{max}$ = 596 nm) $[(p\text{-}(CH_3CH_2)_2NC_6H_4)_3C^+Cl^-]$ |
| Nacure 2530 | Amine blocked p-toluene sulfonic acid (King Industries Speciality Chemicals, Norwalk, CT, USA) |
| TRITON ® X-100 | Octoxynol-9, ethoxylated alkyl phenol (Rohm & Haas, Philadelphia, PA) |
| Trump IR Dye | Infrared absorbing dye ($\lambda_{max}$ = 830 nm) (Eastman Kodak, Rochester, NY, USA) |
| Witco Bond W-240 | Polyurethane resin (Crompton Corp., Chicago, IL, USA) |

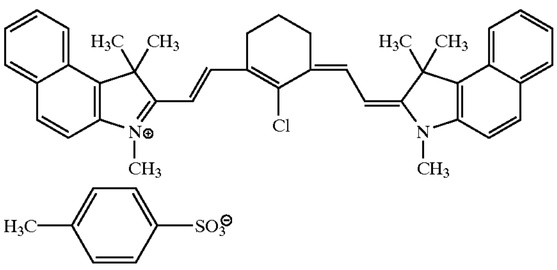

Trump IR Dye

Example 1

A Lithographic Printing Plate was Prepared as Follows:

Underlayer: A solution was prepared by dissolving 10.81 g of Copolymer A in 94.32 g of methyl lactate, 75.46 g of diethyl ketone and 18.86 g of water. To this solution, 0.34 g of ethyl violet and 0.21 g of 10% BYK 307 in propylene glycol methyl ether was added. The solution was stirred until all ingredients were completely dissolved. The solution was then coated on a substrate using a wire wound bar. The substrate was an aluminum sheet substrate, 0.3 gauge, which had been electrograined, anodized and subjected to treatment with a solution of polyvinylphosphonic acid. The coated substrate was dried at 90° C. for 120 sec to provide an underlayer of 1.732 g/m$^2$.

Absorber Layer: A solution was prepared by dissolving 1.66 g ADS-830 WS IR dye and 0.009 g BYK307 in 43.49 g of water and 4.83 g of methanol. The solution was stirred until all ingredients were dissolved. The resulting solution was applied over the underlayer using a wire wound bar, and dried at 90° C. for 120 sec to provide an absorber layer of 0.728 g/m$^2$.

Top Layer: A solution was prepared by dissolving 16.67 g poly(methyl methacrylate) in 83.33 g of toluene. The resulting dispersion was spin coated on the absorber layer and dried at 90° C. for 120 sec to provide a top layer of 0.807 g/m$^2$.

The plate precursor was laser imaged using a test pattern on Creo Trendsetter thermal exposure device having laser diode array emitting at 830 nm and between 100 mJ & 300 mJ output with an imaging energy density of 120 mJ. Upon alkali development with developer 956 negative developer (from Kodak Polychrome Graphics) by hand (25° C. for 30 sec), exposed regions of all layers were removed without affecting the unexposed regions of the layers. An accurate copy of the imaging test pattern was reproduced.

Example 2

The procedure of Example 1 was repeated, except that the absorber layer was 0.3 g/m$^2$ of Trump IR Dye. After imaging and development as described in Example 1, an accurate copy of the imaging test pattern was reproduced.

Example 3

The procedure of Example 2 was repeated , except that the absorber layer was 0.03 g/m$^2$ of Trump IR Dye. After imaging and development as described in Example 1, an accurate copy of the imaging test pattern was reproduced.

Comparative Example 1

The procedure of Example 2 was repeated, except that the absorber layer and underlayer were replaced by a single layer that was 85% Copolymer A and 25% Trump IR Dye and had a coating weight of 2.0 g/m$^2$ (Trump IR Dye coating weight of 0.3 g/m$^2$). After imaging and development as described in Example 1, an accurate copy of the imaging test pattern was reproduced.

Example 4

A Lithographic Printing Plate was Prepared as Follows:

Absorber Layer: A solution was prepared by dissolving 1.66 g of ADS-830 WS IR Dye and 0.009 g of BYK 307 in 43.49 g of water and 4.83 g of methanol. The solution was stirred until all ingredients were dissolved. The resulting solution was spin-coated onto an underlayer, and dried at 90° C. for 120 sec to provide an absorber layer of 0.428g/m$^2$. The underlayer was a conventional Vistar-360 negative-working plate layer (Kodak Polychrome Graphics).

Top Layer: A solution was prepared by dissolving 16.67 g of poly(methyl methacrylate) in 88.33 g of toluene. The resulting dispersion was spin-coated on the absorber layer and dried at 90° C. for 120 sec to provide a top layer of 0.807 g/m$^2$.

The plate precursor was imaged and developed as described in Example 1. The exposed regions of all layers were removed without affecting the unexposed regions of the layers. An accurate copy of the imaging test pattern was reproduced.

Example 5

A Lithographic Printing Plate was Prepared as Follows:

Underlayer: The underlayer was prepared as in Example 1.

Absorber Layer: A solution was prepared by dispersing 12.50 g of carbon black (in 39.6% toluene ) into 87.49 g of toluene and 0.002 g of BYK 307. The resulting dispersion was spin-coated over the underlayer, and dried at 90° C. for 120 sec to provide an absorber layer of 0.23 $g/m^2$.

Top Layer: A solution was prepared by dissolving 2.714 g of Witco Bond W-240 in 91.05 g of water and 2.87 g of butoxyethanol. 0.482 g of Cymel-303, 0.676 g of Nacure 2530, and 0.28 g of TRITON® X 100 were added to the solution, which was stirred until ingredients were dissolved. The resulting dispersion was spin-coated onto the absorber layer and dried at 90° C. for 120 sec to provide a top layer of 0.2 $g/m^2$ . The top layer was then cured by heating the resulting plate for 10 min at 150° C.

The element was exposed and developed as in Example 1. The exposed regions of all layers were removed without affecting the unexposed regions of the layers. An accurate copy of the imaging test pattern was reproduced.

Example 6

Absorber Layer: A solution was prepared by dissolving 2.4 g of Trump IR Dye in 28.5 g of diethyl ketone and 19.1 g of methanol. The solution was stirred until the dye had dissolved. The resulting solution was spin-coated on a substrate as described in Example 1, and on a substrate of 0.3 gauge aluminum sheet that had only been cleaned. The layer was dried at 90° C. for 120 sec to provide an absorber layer of 1.4 $g/m^2$.

Top Layer: The top layer was prepared and applied as in Example 1.

Each of the resulting plate precursors was laser imaged using the test pattern in the Creo Trendsetter with imaging energy densities of 198 mJ, 254 mJ, and 304 mJ.

Upon alkali development with developer 956 negative developer (from Kodak Polychrome Graphics) by hand (25° C. for 30 see), followed by a water rinse, exposed regions of all layers were removed in each of the plate precursors without affecting the unexposed regions of the layers. For both plate precursors and at all imaging energy densities, printing plates that were accurate copies of the imaging test pattern were reproduced.

The resulting printing plates were inked by hand in the presence of water. The ink was held only in the image areas, leaving the substrate free of ink.

Example 7

Absorber Layer: The absorber layer was prepared as described in Example 5. It was coated onto two substrates, the substrate of Example 1 and onto a substrate of 0.3 gauge aluminum sheet that had only been cleaned.

Top Layer: The top layer was prepared and applied onto each of the substrate/absorber layer elements as described in Example 6.

Each of the resulting plate precursors was laser imaged using the test pattern in the Creo Trendsetter with imaging energy densities of 290 mJ, 240 mJ, and 190 mJ. The precursor coated on the substrate of Example 1 (anodized and polyvinylphosphonic acid coated aluminum) was developed with 2 in 1 negative developer diluted to 50% with water. The precursor coated on the substrate of uncoated aluminum was developed with 2 in 1 negative developer diluted to 75% with water. Development was followed by a water rinse, which removed the exposed regions of each of the plate precursors without affecting the unexposed regions of the layers. For both plate precursors and at all imaging energy densities, printing plates that were accurate copies of the imaging test pattern were reproduced.

The resulting printing plates were inked by hand in the presence of water. The ink was held only in the image areas, leaving the substrate free of ink.

Example 8

This example describes the preparation of Copolymer A. Methyl glycol (800 mL) was placed in a 1 L round-bottomed flask equipped with a stirrer, thermometer, nitrogen inlet and reflux condenser. Methacrylic acid (36.12 g), N-phenylmaleimide (165.4 g), and methacrylamide (62.5 g) added and dissolved with stirring 2,2-Azobisisobutyronitrile (AIBN) (3.4 g) was added and the reaction mixture heated at 60° C. with stirring for 22 hr. Then methanol was added, and the precipitated copolymer filtered, washed twice with methanol, and dried in the oven at 40° C. for 2 days.

If the polymerization is carried out in 1,3-dioxolane, in some cases reprecipitation can be avoided. The monomers are soluble in 1,3-dioxolane, but the polymeric material is insoluble and precipitates during the reaction.

Having described the invention, we now claim the following and their equivalents.

What is claimed is:

1. A thermally imageable element comprising:

(a) a hydrophilic substrate;

(b) an absorber layer; and (c) a top layer;

in which:

the top layer comprises a first polymeric material;

the top layer is ink receptive and insoluble in an aqueous alkaline developer;

the top layer and the absorber layer are each removable by the aqueous alkaline developer following thermal exposure; and the absorber layer consists essentially of a photothermal conversion material or a mixture of photothermal conversion materials and, optionally, a surfactant or a mixture of surfactants.

2. The element of claim 1 in which the absorber layer has a coating weight of about 0.02 $g/m^2$ to about 2 $g/m^2$.

3. The element of claim 1 in which the photothermal conversion material is a dye.

4. The element of claim 1 in which the photothermal conversion material is a pigment.

5. The element of claim 1 in which the first polymeric material is selected from the group consisting of acrylic polymers and copolymers; polystyrene; styrene-acrylic copolymers; polyesters; polyamides; polyureas; polyurethanes; nitrocellulosics; epoxy resins; and combinations thereof.

6. The element of claim 1 in which the first polymeric material is a phenolic resin or a water insoluble, base soluble polymeric compound having pendent sulfonamide groups.

7. The element of claim 6 in which the first polymeric material is a novolac resin.

8. The element of claim 7 in which the top layer comprises a compound that contains the o-diazonaphthoquinone moiety.

9. The element of claim 7 in which the top layer comprises a dissolution inhibitor.

10. The element of claim 9 in which the dissolution inhibitor is a triarylmethane dye.

11. The element of claim 7 in which the top layer consists essentially of a novolac resin.

12. The element of claim 7 in which the absorber layer has a coating weight of about 0.02 $g/m^2$ to about 2 $g/m^2$.

13. The thermally imageable element of claim 7 additionally comprising an underlayer between the hydrophilic substrate and the absorber layer, the underlayer comprising a second polymeric material that is soluble or dispersible in aqueous alkaline developer.

14. The thermally imageable element of claim 1 additionally comprising an underlayer between the hydrophilic substrate and the absorber layer, the underlayer comprising a second polymeric material that is soluble or dispersible in aqueous alkaline developer.

15. The element of claim 14 in which the chemical resistance parameter for the underlayer is greater than about 0.5.

16. The element of claim 15 in which the second polymeric material comprises about 35 to about 60 mol % of N-phenylmaleimide; about 15 to about 40 mol % of methacryamide; and about 10 to about 30 mol % of methacrylic acid.

17. The element of claim 15 in which the second polymeric material contains acrylonitrile or methacrylonitrile; methyl methacrylate or methyl acrylate; and about 10 to 90 mol % of a sulfonamide monomer unit.

18. The element of claim 14 in which the under layer comprises a photopolymerizable composition.

19. A method for forming an image, the method comprising the steps of:

thermally exposing a thermally imageable element and forming exposed regions and unexposed regions in the element, and;

removing the exposed regions with an aqueous alkaline developer and forming the image;

in which:

the thermally imageable element comprises:

(a) a hydrophilic substrate;

(b) an absorber layer; and (c) a top layer the top layer comprises a first polymeric material;

the top layer is ink receptive and insoluble in the aqueous alkaline developer;

the top layer and the absorber layer are each removable by the aqueous alkaline developer following thermal exposure;

the absorber layer consists essentially of a photothermal conversion material or a mixture of photothermal conversion materials and, optionally, a surfactant or a mixture of surfactants; and the aqueous alkaline developer has a pH of at least 7 to about 11.

20. The method of claim 19 in which the exposing step is carried out with radiation in the range of 800 nm to 1200 nm.

21. The method of claim 20 in which the absorber layer has a coating weight of about 0.02 $g/m^2$ to about 2 $g/m^2$.

22. The method of claim 21 in which the first polymeric material is selected from the group consisting of acrylic polymers and copolymers; polystyrene; styrene-acrylic copolymers; polyesters; polyamides; polyureas; polyurethanes; nitrocellulosics; epoxy resins; and combinations thereof.

23. The method of claim 21 in which the first polymeric material is a phenolic resin or a water insoluble, base soluble polymeric compound having pendent sulfonamide groups.

24. The method of claim 23 in which the first polymeric material is a novolac resin.

25. The method of claim 24 in which the top layer comprises a compound that contains the o-diazonaphthoquinone moiety.

26. The method of claim 24 in which the top layer comprises a dissolution inhibitor.

27. The method of claim 24 in which the top layer consists essentially of a novolac resin.

28. The method of claim 20 in which the thermally imageable element additionally comprises an underlayer between the hydrophilic substrate and the absorber layer, the underlayer comprising a second polymeric material that is soluble or dispersible in aqueous alkaline developer.

29. The method of claim 28 in which the chemical resistance parameter for the underlayer is greater than about 0.5.

30. The method of claim 29 in which the second polymeric material is selected from the group consisting of (i) polymeric materials that comprise about 35 to about 60 mol % of N-phenylmaleimide about 15 to about 40 mol % of methacryamide; and about 10 to about 30 mol % of methacrylic acid; and (ii) polymeric materials that comprise acrylonitrile or methacrylonitrile; methyl methacrylate or methyl acrylate; and about 10 to 90 mol % of a sulfonamide monomer unit.

31. The method of claim 22 in which the underlayer comprises a photopolymerizable composition.

32. A method for printing, the method comprising the steps of:

forming a printing plate by thermally exposing a printing plate precursor and forming exposed regions and unexposed regions in the precursor, and;

applying an aqueous alkaline developer to the printing plate precursor and forming the printing plate, whereby the exposed regions are removed revealing the underlying substrate;

in which:

the thermally imageable element comprises:

(a) a hydrophilic substrate;

(b) an absorber layer; and (c) a top layer the top layer comprises a first polymeric material;

the top layer is ink receptive and insoluble in the aqueous alkaline developer;

the top layer and the absorber layer are each removable by the aqueous alkaline developer following thermal exposure;

the absorber layer consists essentially of a photothermal conversion material or a mixture of photothermal conversion materials and, optionally, a surfactant or a mixture of surfactants; and the aqueous alkaline developer has a pH of at least 7 to about 11, and applying a fountain solution and then a lithographic ink to the printing plate whereby the ink is taken up by the unexposed regions; and transferring the ink to a receiving material.

33. The method of claim 32 in which the exposing step is carried out with radiation in the range of 800 nm to 1200 nm.

34. The method of claim 33 in which the absorber layer has a coating weight of about 0.02 $g/m^2$ to about 2 $g/m^2$.

35. The method of claim 34 in which the first polymeric material is selected from the group consisting of acrylic polymers and copolymers; polystyrene; styrene-acrylic copolymers; polyesters; polyamides; polyureas; polyurethanes; nitrocellulosics; epoxy resins; and combinations thereof.

36. The method of claim 34 in which the first polymeric material is a phenolic resin or a water insoluble, base soluble polymeric compound having pendent sulfonamide groups.

37. The method of claim 36 in which the first polymeric material is a novolac resin.

38. The method of claim 33 in which the thermally imageable element additionally comprises an underlayer between the hydrophilic substrate and the absorber layer, the underlayer comprising a second polymeric material that is soluble or dispersible in aqueous alkaline developer.

* * * * *